(12) United States Patent
Li et al.

(10) Patent No.: US 10,411,047 B2
(45) Date of Patent: Sep. 10, 2019

(54) ARRAY SUBSTRATE, MANUFACTURING METHOD THEREOF AND DISPLAY DEVICE

(71) Applicant: Shenzhen China Star Optoelectronics Technology Co., Ltd., Shenzhen, Guangdong (CN)

(72) Inventors: Songshan Li, Guangdong (CN); Yuan-Jun Hsu, Guangdong (CN); Zhaosong Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/541,363

(22) PCT Filed: May 25, 2017

(86) PCT No.: PCT/CN2017/085852
§ 371 (c)(1),
(2) Date: Jun. 30, 2017

(87) PCT Pub. No.: WO2018/196075
PCT Pub. Date: Nov. 1, 2018

(65) Prior Publication Data
US 2018/0315778 A1    Nov. 1, 2018

(30) Foreign Application Priority Data
Apr. 28, 2017 (CN) .......................... 2017 1 0295367

(51) Int. Cl.
*H01L 21/02* (2006.01)
*H01L 21/425* (2006.01)
(Continued)

(52) U.S. Cl.
CPC ........ *H01L 27/1288* (2013.01); *H01L 21/426* (2013.01); *H01L 27/127* (2013.01);
(Continued)

(58) Field of Classification Search
CPC .................................................. H01L 27/1288
(Continued)

(56) References Cited

U.S. PATENT DOCUMENTS 8,575,616 B2 * 11/2013 Kim ..................... H01L 27/124
257/401
9,964,854 B2 * 5/2018 Xue .................. H01L 29/66598
(Continued)

FOREIGN PATENT DOCUMENTS

| CN | 102437059 A | 5/2012 |
| CN | 105914134 A | 8/2016 |

*Primary Examiner* — Calvin Lee
(74) *Attorney, Agent, or Firm* — Andrew C. Cheng

(57) ABSTRACT

This disclosure discloses an array substrate and a manufacturing method, and a display device, the array substrate including: a channel layer; a gate insulating layer including a first portion and a second portion connected side by side, arranged on the channel layer, and exposing a source and drain contact zone on the channel layer, the second portion of the gate insulating layer being located on both sides of the first portion of the gate insulating layer; a gate layer, disposed on the first portion of the gate insulating layer; and a source and a drain, correspondingly connected to the contact region of the source and drain of the channel layer respectively. The array substrate of this disclosure solves the array substrate leakage problem caused by conductorizing the channel layer due to performing ion implantation to the channel layer.

8 Claims, 4 Drawing Sheets

(51) Int. Cl.
  *H01L 27/12* (2006.01)
  *H01L 29/08* (2006.01)
  *H01L 21/426* (2006.01)
  *H01L 29/66* (2006.01)
  *H01L 29/786* (2006.01)

(52) U.S. Cl.
  CPC ...... *H01L 27/1225* (2013.01); *H01L 29/0847* (2013.01); *H01L 29/66969* (2013.01); *H01L 29/7869* (2013.01)

(58) Field of Classification Search
  USPC ......... 438/523, 531, 533; 257/335–336, 404, 257/611
  See application file for complete search history.

(56) References Cited

U.S. PATENT DOCUMENTS

| | | |
|---|---|---|
| 10,121,900 B2 | 11/2018 | Hu |
| 2007/0235805 A1 | 10/2007 | Yan |
| 2015/0311351 A1 | 10/2015 | Seko et al. |
| 2016/0049524 A1 | 2/2016 | Shen et al. |
| 2018/0031931 A1 | 2/2018 | Qin et al. |

\* cited by examiner

ARRAY SUBSTRATE, MANUFACTURING METHOD THEREOF AND DISPLAY DEVICE

TECHNICAL FIELD

This disclosure relates to the field of display technology, and more particularly to an array substrate, a manufacturing method thereof, and a display device.

DESCRIPTION OF RELATED ART

At present, IGZO (indium gallium zinc oxide) material gradually becomes the channel layer material in a new generation of array substrate technology, because the carrier mobility of IGZO is 20 to 30 times the ones of the amorphous silicon, it can greatly improve the charge and discharge rate that the thin film transistor to the pixel electrode in the array substrate, thus improve the response speed of pixels, to achieve faster refresh rate, while faster response also greatly improves the pixel line scanning rate.

In the prior art, after the channel layer in the IGZO array substrate is conductorized by ion implantation, oxygen vacancies appear in the conductorized region, and the oxygen vacancies in the conductorized channel layer are liable to migrate into the channel region, resulting in the leakage problems of the array substrate.

SUMMARY

This disclosure mainly provides an array substrate, a manufacturing method thereof, and a display device, for solving the array substrate leakage problem caused by the migration of the oxygen vacancies to the channel region after the channel layer is conductorized by performing an ion implantation to the channel layer in the array substrate.

To solve the above technical problem, one technical solution adopted by this disclosure is to provide an array substrate, including: a channel layer; a gate insulating layer including a first portion and a second portion connected side by side, arranged on the channel layer, and exposing a source and drain contact zone on the channel layer, the second portion of the gate insulating layer being located on both sides of the first portion of the gate insulating layer; a gate layer, disposed on the first portion of the gate insulating layer; a source and a drain, correspondingly connected to the source and drain contact zone of the channel layer respectively, wherein the second portion of the gate insulating layer not covered by the gate layer has a vertical projection length of 1-10 μm on the channel layer.

To solve the above technical problem, another technical solution adopted by this disclosure is to provide a method for manufacturing an array substrate, the method including: forming a channel layer; forming a gate insulating layer and a gate layer on the channel layer sequentially, the gate insulating layer including a first portion and a second portion connected side by side, and exposing a source and drain contact zone on the channel layer, the second portion of the gate insulating layer being located on both sides of the first portion of the gate insulating layer, the gate layer being formed on the first portion of the gate insulating layer; and forming a source and a drain, corresponding to the source and drain contact zone of the channel layer respectively.

To solve the above-mentioned technical problems, another technical solution adopted by this disclosure is to provide a display device, including the above-mentioned array substrate or an array substrate prepared by the above-mentioned method for manufacturing the array substrate.

Distinguishing from the current technology, the beneficial effect of this disclosure is that after the channel layer is conductorized by performing an ion implantation by the second portion of the gate insulating layer disposed on the channel layer, it is difficult for oxygen vacancies of the conductorized region to cross the channel region of the second portion of the corresponding gate insulating layer as the isolation region and to diffuse into the channel region corresponding to the first portion of the gate insulating layer, so that the array substrate leakage problem causesd by conductorizing the channel layer due to performing an ion implantation to the channel layer.

DETAILED DESCRIPTION OF EMBODIMENTS

In order to enable those skilled in the art to understand technical solutions of this disclosure better, a thin film transistor provided by this disclosure and a method of manufacturing the same will be described in further detail below with reference to the accompanying drawings and specific embodiments.

Figure 1:
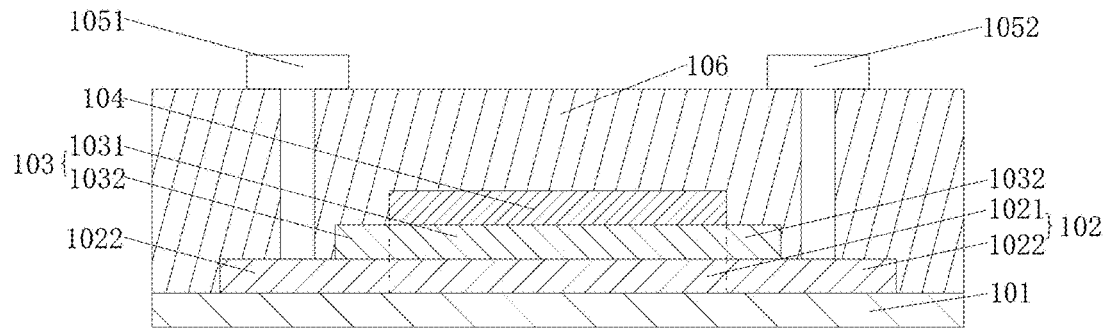
FIG. 1 is a schematic cross-sectional view of an embodiment of an array substrate of this disclosure.

Referring to FIG. 1, a schematic cross-sectional view of an embodiment of an array substrate of this disclosure, includes:

a buffer layer 101, a channel layer 102, a gate insulating layer 103, a gate layer 104, a source electrode 1051, a drain electrode 1052, and a dielectric layer 106.

The channel layer 102 may be disposed on the buffer layer 101, the channel layer 102 includes a channel region 1021 and a source and drain contact zone 1022; the channel region 1021 corresponds to the gate layer 104, and the source and drain contact zone 1022 is an area where the channel region 1021 extends to both side.

The gate insulating layer 103, including a first portion 1031 and a second portion 1032 connected side by side, is disposed on the channel layer 102 and exposes the source and drain contact zone 1022 on the channel layer 102, the second portion 1032 is located on both sides of the first portion 1031.

The gate layer 104 is disposed on the first portion 1031, for example, the gate layer 104 is disposed on the first portion 1031 and may just cover the first portion 1031, and of course may also not just cover the first portion 1031 or may be larger or smaller than the first portion 1031.

Further, the dielectric layer 106 is uniformly covered on the buffer layer 101, the channel layer 102, the first portion 1031, the second portion 1032, and the gate layer 104.

The source electrode 1051 and the drain electrode 1052 go through the dielectric layer 106 and are disposed on the source and drain contact zone 1022 respectively.

The second portion 1032 is disposed between the first portion 1031 and the source electrode 1051 and is disposed between the first portion 1031 and the drain electrode 1052.

In other embodiments, the second portion 1032 may be disposed between the first portion 1031 and the source electrode 1051 or between the first portion 1031 and the drain electrode 1052.

Further, the vertical projection length of the second portion 1032 on the channel layer 102 is 1-10 μm, for example, 1.2 μm, 1.4 μm, 1.6 μm, 1.8 μm, 1.9 μm, 2 μm, 2.5 μm, 3 μm, 4 micron, 5 μm, 6 μm, 7 μm, 8 μm, 9 μm, or 10 μm.

Further, the second portion 1032 may be the extension of the first portion 1031 extending in the direction of the source electrode 1051 and/or the drain electrode 1052, i.e., the material of the second portion 1032 and the first portion 1031 is the same and the vertical projection from the source electrode 1051 to the drain electrode 1052 overlap to each other.

The channel layer 102 may be an amorphous oxide IGZO containing indium, gallium, and zinc, and is mainly composed of $In_2O_3$, $Ga_2O_3$ and ZnO, and is an N-type semiconductor material.

The gate insulating layer is a silicon oxide layer, for example, the gate insulating layer is a silicon dioxide layer.

In other embodiments, the second portion 1032 may not be in contact with the first portion 1031, and the thickness of the second portion 1032 may be different from the first portion 1031.

In the array substrate provided of this embodiment, when performing an ion implantation, the gate layer 104 and the second portion 1032 are used as masks, the source and drain contact zone 1022 is conductorized by ion implantation, because the channel region 1021 corresponding to the second portion 1032 is used as an isolation region, the oxygen vacancies in the source and drain contact zone 1022 is difficult to migrate into the channel region 1021, so that the array substrate leakage problem caused by the migration of oxygen vacancies to the channel region 1021 after the source and drain contact zone 1022 of the array substrate is conductorized by performing an ion implation can be solved.

Figure 2:
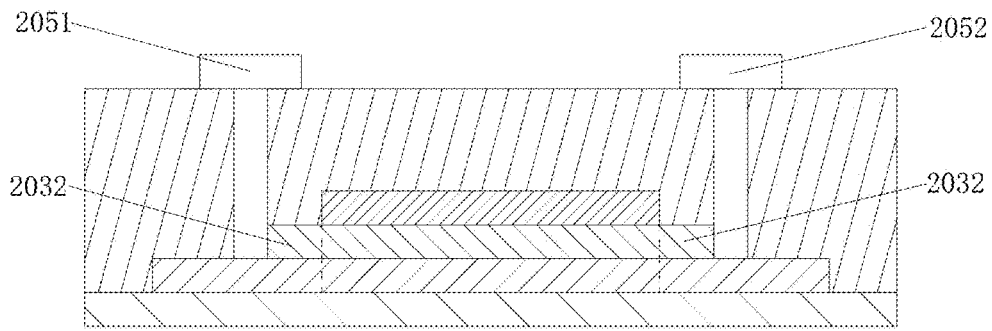
FIG. 2 is a schematic cross-sectional view of another embodiment of the array substrate of this disclosure.

Referring to FIG. 2, a schematic cross-sectional view of another embodiment of the array substrate of this disclosure, wherein the second portion 2032 of the gate insulating layer may be in contact with the source electrode 2051 and the drain electrode 2052 respectively.

In other embodiments, the second portion 2032 may only be in contact with the source electrode 2051 or the drain electrode 2052.

Figure 3:
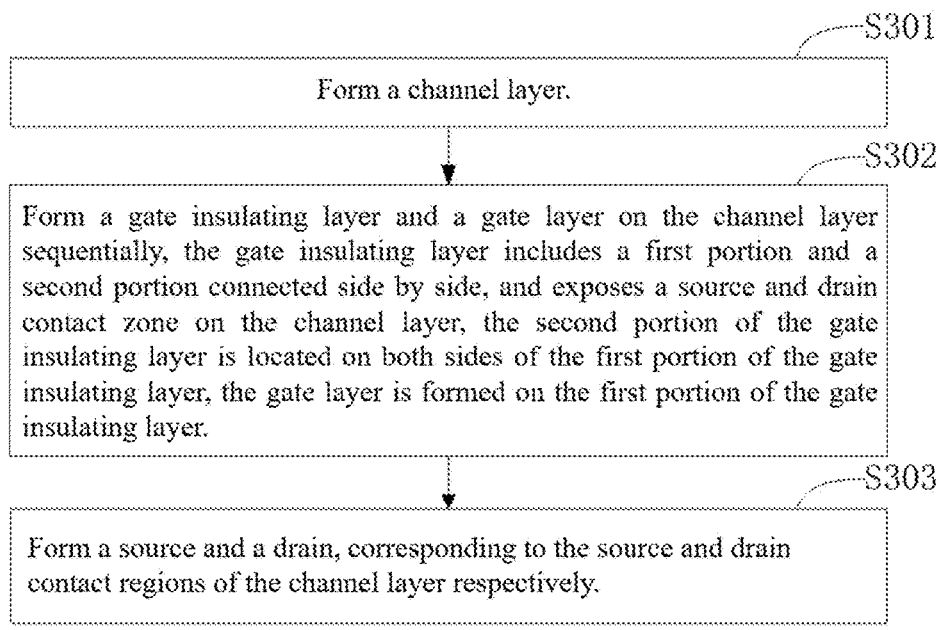
FIG. 3 is a schematic flow diagram of an embodiment of a method for manufacturing the array substrate provided by this disclosure.
Figure 4:
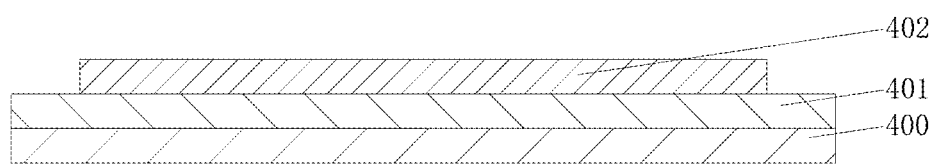
FIG. 4 is a schematic cross-sectional view of the channel layer formed in the manufacturing method provided in FIG. 3.
Figure 5:
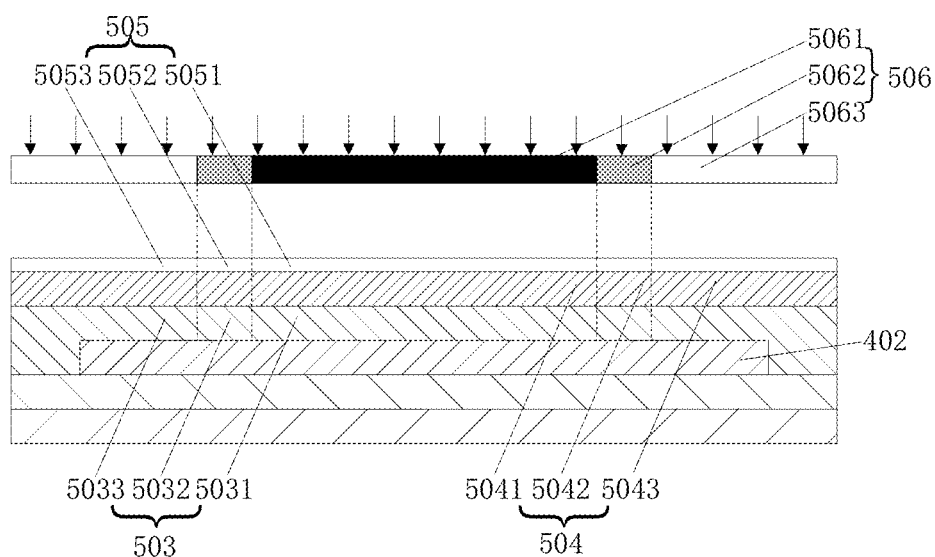
FIG. 5 is a schematic representation of a process for forming a gate layer and a gate insulating layer in the manufacturing method provided in FIG. 3.
Figure 6:
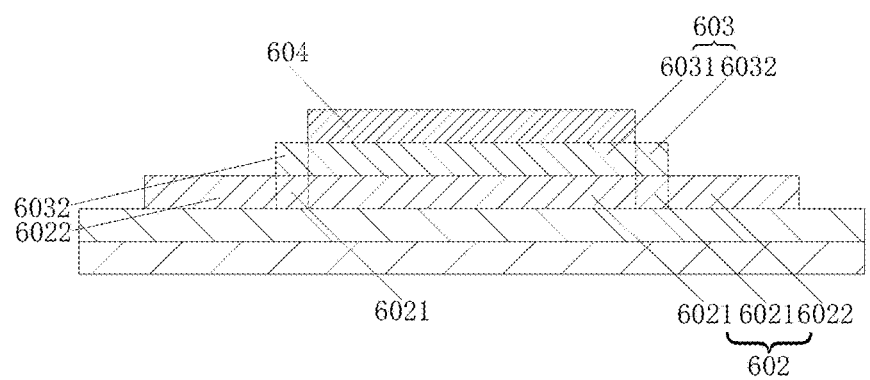
FIG. 6 is a schematic cross-sectional view of the gate layer and the gate insulating layer formed in FIG. 5.
Figure 7:
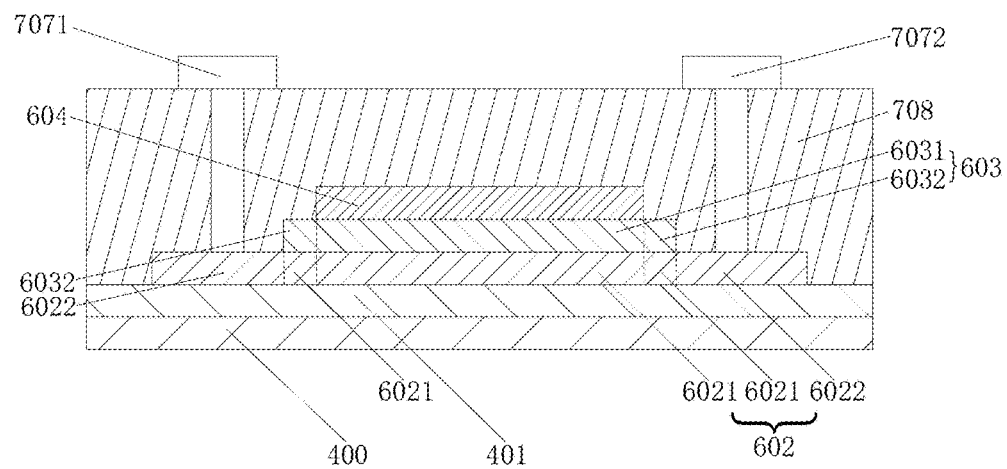
FIG. 7 is a schematic cross-sectional view of an array substrate prepared by the manufacturing method provided in FIG. 3.

Referring to FIG. 3-7 together, FIG. 3 is a schematic flow diagram of an embodiment of a method for manufacturing an array substrate provided by this disclosure; FIG. 4 is a schematic cross-sectional view of the channel layer formed in the manufacturing method provided in FIG. 3; FIG. 5 is a schematic representation of a process for forming a gate layer and a gate insulating layer in the manufacturing method provided in FIG. 3; FIG. 6 is a schematic cross-sectional view of the gate layer and the gate insulating layer formed in FIG. 5; FIG. 7 is a schematic cross-sectional view of an array substrate prepared by the manufacturing method provided in FIG. 3.

S301: Form a channel layer.

The glass substrate 400 may be prepared by forming a silicon-based oxide SiOx buffer layer 401 by a plasma enhanced chemical vapor deposition method on the glass substrate 400, for example, a buffer layer 401 may be formed of silicon dioxide.

An IGZO layer prepared as a channel layer is formed on the buffer layer 401, and a physical vapor deposition method or a laser pulse deposition method may be used, followed by exposure, development, etching, and peeling processes. Further, the patterned channel layer 402 covering the buffer layer 401 may be obtained.

IGZO is an amorphous oxide containing indium, gallium, and zinc, is mainly composed of $In_2O_3$, $Ga_2O_3$, and ZnO, and is an N-type semiconductor material.

S302: Form a gate insulating layer and a gate layer on the channel layer sequentially, the gate insulating layer includes a first portion and a second portion connected side by side, and exposes a source and drain contact zone on the channel layer, the second portion of the gate insulating layer is located on both sides of the first portion of the gate insulating layer, the gate layer is formed on the first portion of the gate insulating layer.

A gate insulating layer 503 is formed on the channel layer 402, the gate insulating layer 503 may be formed by chemical vapor deposition, and the gate insulating layer 503 may be a silicon oxide layer, for example, silicon dioxide.

Further, a gate layer 504 is formed on the gate insulating layer 503, and a metal layer may be deposited by physical vapor deposition to form the gate layer 504.

Further, a gate insulating layer 603 including a patterned first portion 6031 and a second portion 6032 and a patterned gate layer 604 are obtained by exposure, development, etching, and peeling processes.

In particular, the photomask used in the lithographic processing step may be a grayscale mask 506, which may also be referred to as a halftone mask.

Further, the grayscale mask 506 may be composed of a first grayscale light transmission region 5061, a second grayscale light transmission region 5062, and a third grayscale light transmission region 5063, the first grayscale light transmission region 5061 has the lowest light transmittance, the light transmittance of the second light transmission region 5062 is higher than that of the first light transmission region 5061, and the light transmittance of the third light transmission region 5063 is higher than that of the second light transmission region 5062.

Further, a positive photoresist layer 505 is coated on the gate layer 504, the dissolution rate of the positive photoresist layer 505 is slow at the time of etching, but after the illumination, the dissolution rate becomes faster depending on the intensity and time of the illumination, i.e., under the same illumination time, the dissolution rate of the positive photoresist layer 505 becomes faster as the light intensity is higher.

Further, the grayscale mask 506 is disposed directly above the positive photoresist layer 505, and the positive photoresist layer 505 is vertically illuminated on the upper side of the grayscale mask 506. since the first light transmission region 5061 has the lowest light transmittance, the first light exposure area 5051 corresponding to the positive photoresist layer 505 is barely illuminated so that the first light exposure area 5051 is difficult to dissolve; since the second light transmission region 5062 has a certain light transmittance, the dissolution rate of a second exposure area 5052 corresponding to the positive photoresist layer 505 becomes faster due to a certain light illumination; and the third light transmission region 5063 has the highest light transmittance so that the third exposure area 5053 corresponding to the positive photoresist layer 505 is illuminated the most, the dissolution rate of the third exposure area 5053 becomes the fastest.

Further, while performing the etching, since the first exposure area 5051 is difficult to dissolve, the third exposure area 5053 can protect the lower structure from being etched and dissolved. Since the dissolution rate of the second exposure area 5052 becomes faster, when a certain etching condition is set, it can be achieved that the second exposure area 5052 and the gate layer 5042 below the second exposed area 5052 is etched and dissolved, and the gate insulating layer 503 is not etched and dissolved. Since the dissolution rate of the third exposed region 5053 is the fastest, when a certain etching condition is set, the gate layer 5043 below the third exposure region 5053 and the gate insulating layer 5033 are not protected and can be totally etched and dissolved, and the etching solution selected here does not react with the channel layer in the case.

By controlling the factors affecting the etching rate such as the light transmittance adjustment of the first light transmission region 5061, the second light transmission region 5062, and the third light transmission region 5063, the intensity and time of the illumination control, the selection and the ratio of the etching solution, the etching mode, the etching temperature and time, so that the effect can be achieved that only the gate insulating layer 5033, the gate layer 5042, and the gate layer 5043 are etched away without etching the gate layer and the gate insulating layer in the other regions; and thus the patterned gate insulating layer 603 and the patterned gate layer 604 as shown in FIG. 6 are obtained.

Further, the source and drain contact zone 6022 of the channel layer 602 is conductorized by ion implantation in a self-aligned manner with the patterned gate layer 604 as a mask, and then subjected to an annealing treatment.

The ion implanted by ion implantation may be one of oxygen, argon or sulfur hexafluoride, while the second portion 6032 serves as a mask, it makes the isolation region 6021 between the source and drain contact region 6022 and the channel region 6021 as an isolation without being ion implanted.

The source and drain contact zone 6022 after ion implantation is subjected to an annealing treatment to recover a structural defect caused by ion implantation to the source and drain contact zone 6022.

As can be seen in FIG. 5, although not all of the region are marked due to the limitation of the picture space, the gate insulating layer 5033, the gate layer 5042, the gate layer 5043, the second exposure area 5052, and the third exposure area 5053, the second light transmission region 5062, and the third light transmission region 5063 are disposed opposite to each other.

As described above, since the isolation effect of the isolation region 6021, the oxygen vacancies in the source and drain contact zone 6022 are difficult to migrate through the isolation region to the channel region 6021 after the source and drain contact zone 6022 is conductorized by ion implantation.

S303: Form the source and drain, and connect the corresponding to the source and drain contact zone of the channel layer respectively.

The dielectric layer 708 is formed on the buffer layer 401 after the annealing treatment, the dielectric layer 708 is uniformly covered over the buffer layer 401, the channel layer 602, the first portion 6031, the second portion 6032, and the gate layer 604, a silicon oxide layer may be formed by including but not limited to chemical vapor deposition, the silicon oxide layer is the dielectric layer 708, the dielectric layer 708 is capable of isolating the influence of external oxygen or water molecules on the channel layer 602, playing a role of protecting the stability of the channel layer 602.

Further, a patterned contact hole may be formed by photoresisting coating and exposure of the dielectric layer 708, and then subjected to dry etching and removal of material, and then the contact hole penetrating through the dielectric layer 708 and connecting to the source and drain contact zone 6022.

Further, a metal can be deposited in the two contact holes by physical vapor deposition to form a metal layer, and then the photoresist layer is deposited on the deposited metal layer, followed by exposure, development, etching and stripping processes to obtain a patterned source electrode 7071 and a patterned drain electrode 7072, and the obtained source electrode 7071 and the drain electrode 7072 are in contact with the source and drain contact zone 6022.

Distinguishing from the prior art, when the channel layer is subjected to ion implantation in this disclosure, the gate layer is used as a self-aligned mask, and the second portion of the gate insulating layer is used as a mask, the oxygen vacancies in the asource and drain contact zone are difficult to migrate through the isolation region to the channel region after the ion-contact region is ion-implanted after the source and drain contact zone is conductorized by ion implantation, so that the leakage problem of the array substrate caused by the migration of the oxygen vacancy to the channel region after the channel layer is conductorized due to an ion implantation of the channel layer in the array substrate can be solved.

Figure 8:
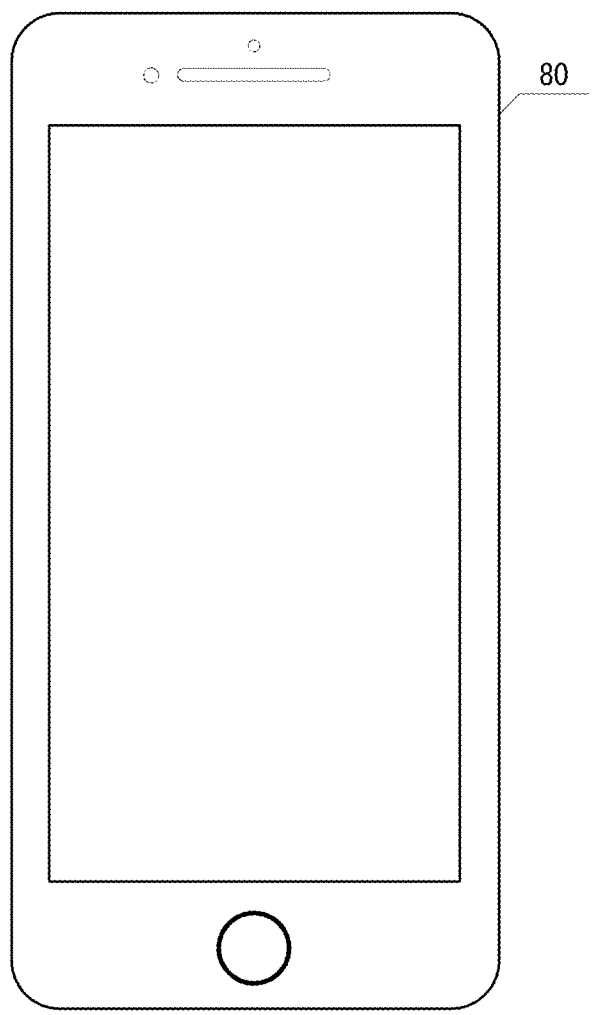
FIG. 8 is a schematic structural view of an embodiment of the display device of this disclosure.

Referring to FIG. 8, FIG. 8 is the schematic structural view of an embodiment of the display device of this disclosure.

The array substrate in the display device 80 is an array substrate of this disclosure or an array substrate prepared by the method of manufacturing an array substrate of this disclosure as described above.

Above are only embodiments of this disclosure is not patented and therefore limit the scope of this disclosure, the use of any content of the present specification and drawings made equivalent or equivalent structural transformation process, either directly or indirectly related to the use of other technologies areas are included in the same way the scope of the patent protection of this disclosure.

What is claimed is:
1. An array substrate, comprising:
a channel layer;
a gate insulating layer, comprising a first portion and a second portion connected side by side, arranged on the channel layer, and exposing a source and drain contact zone on the channel layer, the second portion of the gate insulating layer being located on both sides of the first portion of the gate insulating layer;
a gate layer, disposed on the first portion of the gate insulating layer;
a source and a drain, correspondingly connected to the source and drain contact zone of the channel layer respectively; and
a length of the channel layer is greater than a length of the gate insulating layer,
wherein the channel layer comprises a channel region, an isolation region, and a source and drain contact zone, wherein the channel region is located corresponding to the first portion of the gate insulating layer, and the isolating region is located corresponding to the second portion of the gate insulating layer, and wherein the second portion of the gate insulating layer, and the source and the drain are contacted with each other.

2. The array substrate according to claim 1, wherein the second portion of the gate insulating layer not covered by the gate layer has a vertical projection length of 1-10 μm on the channel layer.

3. The array substrate according to claim 1, wherein the second portion of the gate insulating layer extends to the source and the drain.

4. The array substrate according to claim 1, wherein the gate insulating layer is a silicon oxide layer.

5. A display device, which comprises an array substrate, the array substrate comprising:
   a channel layer;
   a gate insulating layer, comprising a first portion and a second portion connected side by side, arranged on the channel layer, and exposing a source and drain contact zone on the channel layer, the second portion of the gate insulating layer being located on both sides of the first portion of the gate insulating layer; a gate layer, disposed on the first portion of the gate insulating layer;
   a source and a drain, correspondingly connected to the source and drain contact zone of the channel layer respectively; and
   a length of the channel layer is greater than a length of the gate insulating layer, wherein the channel layer comprises a channel region, an isolation region, and a source and drain contact zone, wherein the channel region is located corresponding to the first portion of the gate insulating layer, and the isolating region is located corresponding to the second portion of the gate insulating layer, and wherein the second portion of the gate insulating layer, and the source and the drain are contacted with each other.

6. The display device according to claim 5, wherein the second portion of the gate insulating layer not covered by the gate layer has a vertical projection length of 1-10 μm on the channel layer.

7. The display device according to claim 5, wherein the second portion of the gate insulating layer extends to the source and drain.

8. The display device according to claim 5, wherein the gate insulating layer is a silicon oxide layer.

\* \* \* \* \*